United States Patent [19]

So

[11] Patent Number: 4,795,969
[45] Date of Patent: Jan. 3, 1989

[54] LOAD LOSS STANDARD FOR TESTING AND CALIBRATING HIGH VOLTAGE POWER MEASURING SYSTEMS

[75] Inventor: Eddy So, Gloucester, Canada

[73] Assignee: Canadian Patents and Development Limited, Ottawa, Canada

[21] Appl. No.: 131,916

[22] Filed: Dec. 11, 1987

[51] Int. Cl.⁴ .................. C01R 11/32; H01F 40/14
[52] U.S. Cl. ............................ 324/74; 324/55; 324/130; 323/356
[58] Field of Search .............. 324/59, 74, 55, 130; 330/85; 323/356, 357, 358

[56] References Cited

U.S. PATENT DOCUMENTS

| | | | |
|---|---|---|---|
| 3,390,327 | 6/1968 | Bosworth et al. | 324/74 |
| 4,213,083 | 7/1980 | Freygan | 323/356 X |
| 4,258,315 | 3/1981 | Westra | 324/59 |
| 4,467,269 | 8/1984 | Barzen | 323/356 X |
| 4,528,498 | 7/1985 | So | 324/59 |
| 4,554,513 | 11/1985 | So | 330/85 |

OTHER PUBLICATIONS

"A Current-Comparator-Based Load Loss . . . Systems", E. So, IEEE Summer Meeting, July 12-17, 1987, San Francisco, CA, pp. 1-6.
"Calibration of Test Systems . . . Transformers", E. So, IEEE Transactions, vol. PWRD-1, No. 4, Oct. 1986, pp. 215-223.
"A Comparison of Instrumentation . . . Transformers", E. So, IEEE Transactions, vol. PAS-102, No. 6, Jun. 1983, p. 1570-1573.

Primary Examiner—Reinhard J. Eisenzopf
Assistant Examiner—Vinh P. Nguyen
Attorney, Agent, or Firm—Yoshiharu Toyooka

[57] ABSTRACT

A current-comparator technique for obtaining a load loss standard with adjustable loss tangent (or power factor) for in-situ calibration of transformer loss measuring system is described. The load loss standard, driven by the test voltage through a low-loss high-voltage compressed-gas-dielectric reference capacitor, simulates an inductive load which can be operated with load currents of up to 1000 A. For a 500 kV reference capacitor and a load current of 1000 A, the load loss standard simulates an equivalent inductive load with a rating of 500 MVA. Adjustment of the loss tangent (or power factor) is achieved by comparing the load current, using the current comparator, with in-phase and quadrature reference currents derived from the test voltage.

17 Claims, 3 Drawing Sheets

LOAD LOSS STANDARD FOR TESTING AND CALIBRATING HIGH VOLTAGE POWER MEASURING SYSTEMS

FIELD OF THE INVENTION

The present invention relates generally to accurate load loss measurements of large power transformers at low power factors. In particular, it relates to load loss standards with adjustable loss tangent (or power factor) for in-situ calibration of transformer loss measuring systems.

BACKGROUND OF INVENTION

Accurate load loss measurements of large power transformers at low power factors are difficult because of the presence of large quadrature component of current. The acceptable accuracy limits when measuring load loss in large power transformers are important to manufacturers and utilities since there is a penalty (as high as $5000/kilowatt) for every kilowatt of load loss exceeding the guaranteed value. For a power measurement that is accurate to 1 percent of 0.01 power factor, a technique with an overall accuracy of $(0.01 \times 1\%)$ or 0.01 percent is required. This is equivalent to a total phase error, of not more than 100 rad anywhere in the measurement system, usually in the voltage and current transducers, or if there are no phase errors, an accuracy of 100 ppm (parts per million) of full scale in the wattmeter. Considering the stringent high accuracy requirement and the high penalty, it is important that loss measuring systems be calibrated after installation and recalibrated on a regular basis. Calibration of a test system and more recently not only that of a test system but also of its principal components have been described in a "A comparison of instrumentation for measuring the losses of large power transformers," Malewski et al., IEEE Trans. Power App. Syst., Vol. PAS-102, No. 6 pp 1570–1573, June 1983 and "Calibration of test systems for measuring power losses of transformers," Mehta et al., IEEE Trans. Power Delivery, Vol. PWRD-1, No. 4, pp. 215–22, Oct. 1986. System-based calibration is done by comparing the results of loss measurement with those of more accurate test system on the same transformer. This calibration method usually provides a system-based verification at only one voltage and one current range and at a particular power factor determined by the transformer under test. An alternative method would be the use of a standard load with a known stable loss, providing a reference power to the test system. Ideally, the standard load should be operable over different voltage, current, and power factor ranges. Such a standard load would provide a means for characterizing the accuracy of transformer loss measuring systems over different voltage, current, and power factor ranges.

OBJECTS OF INVENTION

It is therefore an object of the present invention to provide a standard load for testing and calibrating a transformer loss measuring system by generating a standard load current when connected to a high voltage source and the transformer measuring system.

It is another objet of the present invention to provide a standard load whose load current is adjustable for testing and calibrating a transformer measuring system.

It is a further object of the present invention to provide a standard load whose loss tangent (or power factor) is adjustable for testing and calibrating a transformer loss measuring system.

It is still another object of the present invention to provide a load loss standard which includes a current comparator.

SUMMARY OF INVENTION

According to the present invention a load loss standard is provided for testing and calibrating a transformer loss measuring system by generating a standard load current when connected to a high voltage source and the transformer loss measuring system. The standard includes voltage divider means, to be connected to the high voltage source, for generating reference signals indicative of a reference load current flowing therethrough. Current comparator means including first current comparator and having at least first, second, third and detection winding circuits is provided and the first winding circuit is to be connected to the transformer loss measuring system. It further includes amplifier means connected to the voltage divider means for generating a standard load current having a preset loss tangent, in response to the reference signals and for applying the standard load current to the first winding circuit and the transformer loss measuring system. Connecting means is provided to the voltage divider means for applying the reference signals to the second and third winding circuits, and detection means is connected to the detection winding circuit for generating and applying a feedback signal to the amplifier means to fine adjust the standard load current.

BRIEF DESCRIPTION OF DRAWINGS

The accompanying drawings illustrate, by way of example, embodiments of the present invention, in which.

DETAILED DESCRIPTION OF PREFERRED EMBODIMENT

Briefly stated, according to the present invention, the load loss standard, driven by a high voltage source through a low-loss high-voltage compressed-gas-dielectric reference capacitor, simulates an inductive load which can be operated with load currents of up to 1000 A. Adjustment of the loss tangent (or power factor) is achieved by means of comparing the load current, using the current comparator, with in-phase and quadrature reference current derived from the high voltage source.

Figure 1:
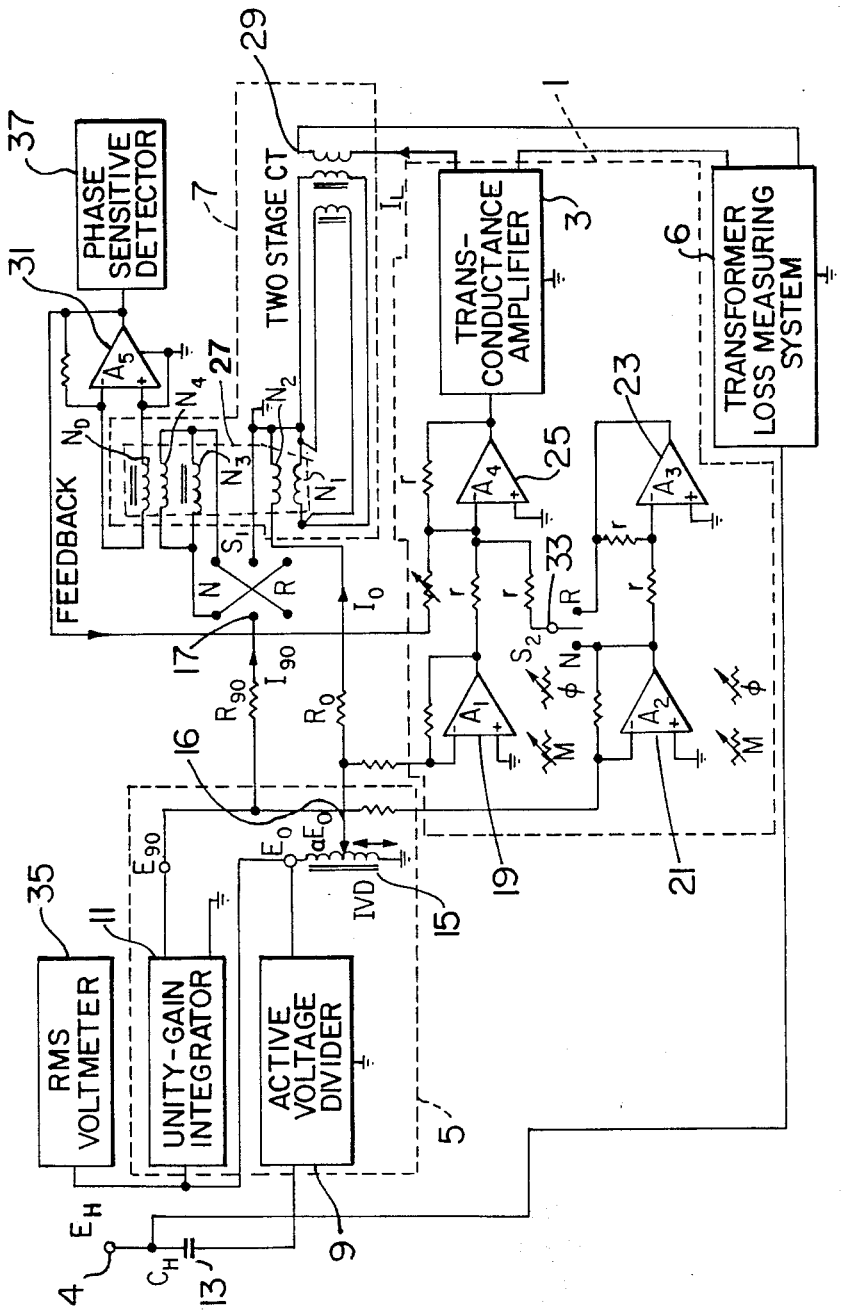
FIG. 1 is a schematic diagram of the load loss standard according to the present invention.

FIG. 1 is a schematic diagram of the current-comparator-based load loss standard, according to one embodiment of the invention. It consists of three main parts, (A) amplifier means 1 including a transconductance amplifier 3 to generate a standard load current $I_L$ at its output, (B) voltage divider means 5 to be connected to a high voltage source 4 to generate in-phase and quadrature reference voltage signals in response to the in-phase and the quadrature components respectively of a load current flowing through a large power transformer and its loss measuring system 6, (C) current comparator means 7 to compare the standard load current at the output of the amplifier means with the reference voltage signals from the voltage divider means. In this embodiment, the voltage divider means 5 includes an active voltage divider 9 and a unity gain integrator 11. The active voltage divider 9 is coupled to the high voltage source $E_H$ through a low-loss high-voltage compressed-gas-dielectric reference capacitor reference capacitor 13. The in-phase reference volage signal $E_0$ and the quadrature reference voltage signal $E_{90}$ of the load current are produced at the outputs of the active voltage divider 9 and the unity gain integrator 11 respectively, both of which will be described in detail below. The voltage divider means further includes an inductive voltage divider 15 whose ratio is adjustable by means of an adjusting means 16. The in-phase signal reference voltage $E_0$ and the quadrature signal reference voltage $E_{90}$ are applied through reference resistors $R_{10}$ and $R_{90}$ and a switch 17 to the current comparator means 7 in the forms of in-phase and quadrature reference current signals $I_0$ and $I_{90}$ proportional to $E_0$ and $E_{90}$ respectively. The amplifier means 1 includes, in addition to the transconductance amplifier which is in this embodiment a voltage-to-current converter, operational amplifiers 19, 21, 23 and 25 and receives the in-phase signal through the inductive voltage divider 15 and the quadrature signal from the voltage divider means. The magnitude and phase of the output voltages of the amplifiers 19 and 21 are such that the in-phase and quadrature components of the standard load current $I_L$ are proportional to the reference currents $I_0$ and $I_{90}$ respectively. The transconductance amplifier 3 driven by the summing amplifier 25 causes the standard load current $I_L$ to flow in the current comparator means which includes a current comparator 27, a two-stage current transformer 29 as a ratio extender. The standard load current $I_L$ causes a current in the first winding $N_1$ of the current comparator 27 to keep the net ampere-turn in the current comparator approximately zero.

The detection winding circuit includes the detection winding $N_D$ of the current comparator 27. A feedback signal is produced by an amplifier 31 connected to the detection winding $N_D$. The feedback signal is applied to the amplifier means 1 to form a closed loop control. The feedback signal tends to keep the net ampere-turn unbalance at zero.

For an integrator with unity gain at 60 Hz, the quadrature reference voltage signal signal $E_{90}$ can be expressed as $$-j\frac{60}{f} E_0$$

where f is the frequency of the source and $E_0$ is the in-phase reference voltage signal of the active voltage divider. At the balance, therefore, the in-phase and quadrature components of the standard load current $I_L$ are given by $$I_L = \left[\frac{\alpha E_0}{R_0} N_2 - j\frac{60}{f} \frac{E_0}{R_{90}} N_3 \right]\frac{N}{N_1} \quad (1)$$

where N is the winding ratio of the two-stage current transformer (ratio extender) and $\alpha$ is the ratio of the inductive voltage divider ($0 < \alpha < 1$). $N_1$, $N_2$ and $N_3$ are the first, the second and the third windings of the current comparator 27. Thus the standard load current $I_L$ lags the in-phase reference voltage signal $E_0$ or the high voltage $E_H$, and has a frequency characteristic similar to that of an inductive load with a loss tangent given by $$\tan \delta = \frac{\alpha f}{60} \frac{R_{90}}{R_0} \frac{N_2}{N_3} \quad (2)$$

where $\delta$ is the equivalent loss angle of the load loss standard. For f=60 Hz, the ratio dial setting of the inductive voltage divider 15 is made direct reading in loss tangent with an adjustment range from 0 to 0.1 by making $$\frac{R_{90}}{R_0} = 0.1 \text{ and } \frac{N_2}{N_3} = 1.$$

A five-decade inductive voltage divider provides five-digit resolution in the loss tangent setting. The loss tangent setting at 60 H is, therefore, given by $$\tan \delta = 0.1\alpha \quad (3)$$

Since for low power factor (less than 0.1) the difference between power factor and its corresponding loss tangent is small (approximately equal to the square of the power factor divided by two), the loss tangent settings can be considered to be also direct reading in power factor. The dials, of course, can be set to give the correct corresponding power factor. Although the load loss standard is meant to simulate an inductive load with lagging currents, leading currents can be obtained by reversing the polarities of windings $N_3$ and $N_4$ by switch 17 and that of the output voltage of amplifier 21 by an additional amplifier 23 an a switch 33 (switches 17 and 33 in position R). An RMS voltmeter 35 is attached to the voltage divider means and a phase sensitive detector 37 to the detection circuit.

Certain components of the loss standard will be described in detail below.

Transconductance Amplifier

The transconductance amplifier is a commercial voltage-to-current converter with output range of 10 A and 100 A. A 10-10-1 step-up current transformer extends the high range to 1000 A (not shown in FIG. 1). The ratio of the step-up current transformer is limited by the stability and the compliance voltage of the transconductance amplifier. The closed-loop gain of the feedback circuit from the detection winding $N_D$ to the transconductance amplifier is approximately 100 and is sufficient to correct for output change in the transconductance amplifier due to nonlinearities and temperature effects. The accuracy and stability requirements of the transconductance amplifier and those of the step-up current transformer are, therefore, not critical.

Active Voltage Divider

Figure 2:
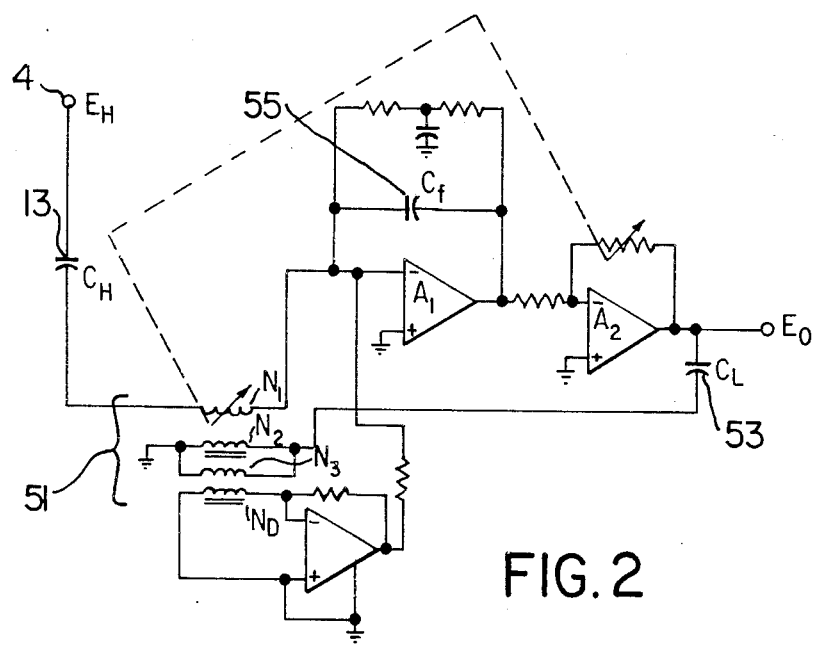
FIG. 2 shows a schematic illustration of current comparator high-voltage active divider according to an embodiment of the invention.

FIG. 2 shows schematically the active voltage divider which is basically a capacitive divider consisting of a low-loss high-voltage compressed-gas-dielectric capacitor, an operational amplifier with capacitive feedback, and a current comparator to automatically correct the ratio and phase errors. Detailed discussion of the active voltage divider can be found in U.S. Pat. No. 4,554,513, Nov. 19, 1985 (So). The current comparator 51 compares the current in the low-loss high-voltage capacitor 13 with the current obtained by applying the output signals $E_0$ to a stable and low-loss low-voltage gas-dielectric capacitor 53. Due to the magnitude and phase errors of the output signal $E_0$, the current comparator will not be in ampere-turn balance. The difference current derived from the output of the detection winding is added, through a feedback circuit, to the current in the solid-dielectric feedback capacitor 55 resulting in a highly accurate and stable output signal $E_0$. The error due to the magnitude error and phase angle defect of the solid-dielectric feedback capacitor 55 are reduced by the gain of the feedback circuit. The active voltage divider has an equivalent feedback capacitor 55 of 265.2 nF, a nominal output voltage of 100 V, and five gain settings of 1, 2, 5, 10 and 20.

The output signal $E_0$ is, therefore, given by $$E_0 = \frac{C_H \times G \times E_H}{265200} \quad (4)$$

where $C_H$ us the capacitance of the high-voltage reference capacitor in picofarads and G is the gain setting of the divider. Thus the divider, using the same high-voltage reference capacitor, can be operated at five different ratios which in turn allows the current-comparator-based load loss standard to be operated over five different voltage ranges. Of course any number of ranges can be provided by using different gain settings. The current input to the divider at 60 Hz is limited to 10 mA. This limit was made to coincide with the voltage ratings of the available high-voltage compressed-gas-dielectric reference capacitors 13, which are 50 pF, 500 kV and 100 pF, 250 kV. For a gain G of the divider corresponding to $(G) \times (E_H \omega C_H) = 10$ mA, where $\omega$ is the angular frequency at 60 Hz, the output signal $E_0$ is 100 V. Thus for a 50 pF, 500 kV reference capacitor, the voltage ranges of the current-comparator-based load loss standard are 500 kV, 250 kV, 100 kV, 50 kV, and 25 kV, corresponding to gain settings G of 1, 2, 5, 10 and 20, respectively. The maximum load current of each range of the transconductance amplifier (10 A, 100 A and 1000 A) is, therefore, available at voltage levels of 500 kV, 250 kV, 100 kV, 50 kV and 25 kV. The divider has a stability and phase accuracy at all ratios of better than $\pm 10$ ppm and $\pm 10$ $\mu$rad respectively.

Figure 3:
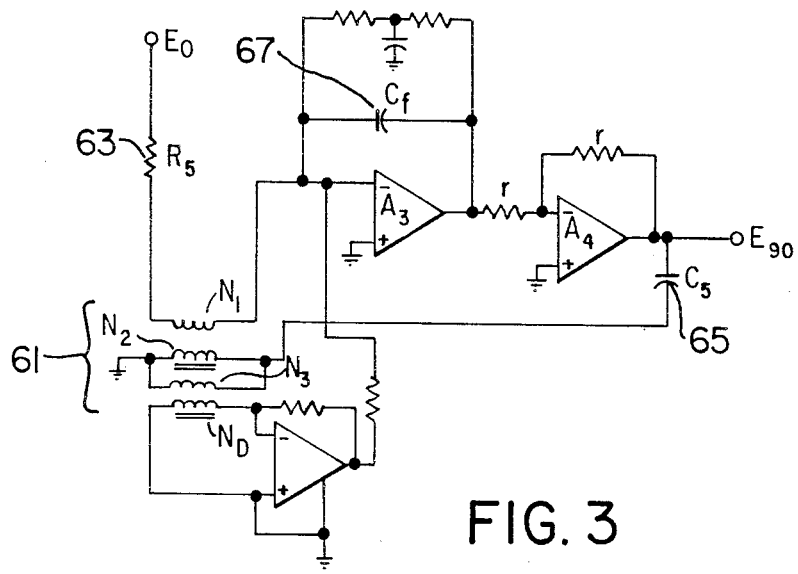
FIG. 3 illustrates one embodiment of current comparator unity gain integrator according to the invention.

FIG. 3 shows schematically the basic current-comparator active voltage divider circuit which is adapted to obtain a highly accurate unity-gain integrator. Reference can be had to the U.S. Pat. No. 4,554,513, Nov. 19, 1985 (So) for detail discussion of the active voltage divider. The magnitude and phase errors of the quadrature output signal $E_{90}$, as in the case of the current-comparator active voltage divider, are reduced by the gain of the feedback circuit. The quadrature output $E_{90}$, therefore, is a highly accurate voltage, lagging 90° with respect to the integrator input voltage $E_0$ or the test voltage $E_H$. The values of a resistor 63, a reference capacitor 65, a feedback capacitor 67 and the winding ratio of the current comparator 61 are such that, at 60 Hz, the integrator has a gain of 1 with magnitude and phase accuracies of better than $\pm 10$ ppm and $\pm 10$ $\mu$rad respectively.

Current Comparator

Although only windings with a fixed number of turns are required for this application, windings $N_2$ and $N_3$ have an adjustable number of turns in order to enhance the flexibility of the current comparator for other uses such as performing self-checking operations, and facilitating its use in impedance bridge circuits. The windings $N_2$ and $N_3$ have nominal 100 turns, providing two-digit resolution. Additional resolution is obtained by two cascade arrangements of 100-turn two-stage current transformers for the third and fourth digits, and 100-turn single-stage current transformers for the fifth and sixth digits. The fixed winding $N_1$ has 100 turns and is subdivided to yield overall ratio multipliers of 1, 2, 5, 10, 20, 50 and 100. The compensation winding $N_4$ also has 100 turns and is connected in parallel with winding $N_3$ in order to reduce its leakage impedance. A 500-turn detection winding $N_P$ is connected to a current-to-voltage converter to obtain a voltage proportional to, and in-phase with, the unbalanced ampere-turns in the current comparator.

The nominal current rating of the comparator and auxiliary transformers in cascade is one ampere-turn. This limits the current in the $N_3$ (or $N_2$) and $N_1$ windings to 0.01 A and 1 A respectively. For this application winding $N_1$ is set to provide a ratio multiplier of 100, and windings $N_2$ and $N_3$ are adjusted to have 100 turns so that $N_3/N_2 = 1$ (See equations (2) and (3)). Since the nominal output voltage of the active voltage divider ($E_0$) and that of the unity gain integrator ($E_{90}$) is 100 V and since $R_{90}/R_0 = 0.1$, the values of the reference resistors $R_{90}$ and $R_0$ must be 10 k$\Omega$ and 100 k$\Omega$ respectively. To accommodate load currents of up to 1000 A, an additional range-extending two-stage current transformer with ratios of 1000/100, and 10 to one is employed. The ratio errors of the current comparator including that of the ratio extender are no greater than $\pm 10$ ppm in both magnitude and phase.

Performance

The reference power or equivalent load power loss seen by the test system is determined by the test voltage $E_H$ and the in-phase or loss component of the load current $I_L$ which in turn is determined by the loss tangent setting. From equations (1) and (3), the reference power is obtained from the measurement of the output voltage $E_0$ of the active voltage divider and the loss tangent setting using standard was $$P_L = 10 \, A \cdot \frac{E_0^2}{R_0} \cdot N_T \cdot \tan \delta \quad (5)$$

where $P_1$ is the reference power (or equivalent load power loss), A is the ratio of the active voltage divider obtained from equation (4), $N_T$ is the overall current comparator winding ratio including that of the ratio extender, and $\tan \delta$ is the loss tangent setting.

Figure 4:
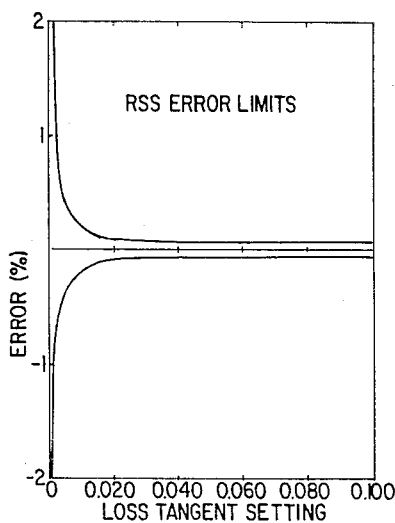
FIG. 4 is a graph showing RSS (root sum of squares) error limits as a function of loss tangent settings.

The performance of the current-comparator-based load loss standard was checked at low voltage using a time-division-multiplier (TDM) reference wattmeter with an accuracy of better than 30 ppm of full scale, and voltage and current ranges of 120 V and 1 A, respectively. The value of the reference capacitor $C_H$ and the gain setting G of the active voltage divider were such that a test voltage of 120 V, depending on the current range of the transconductance amplifier, the load current could be selected to be either 10 A, 100 A, or 1000 A. In order to provide an independent check, the current input to the wattmeter was obtained from a separate range-extending two-stage current transformer. The accuracy of the test voltage was better than 50 ppm, which is equivalent to an error of less than 10 ppm with respect to full scale in the wattmeter reading at 0.1 loss tangent. The reference power $P_L$ was measured at the wattmeter at loss tangent settings of 0, 0.005, 0.010, 0.020, 0.040, 0.060, 0.080, and 0.100. The results are shown in FIG. 4 with the error $\Delta P$ defined as the power measured by the wattmeter minus the reference power $P_L$ divided by the apparent power in ppm. The results show that the absolute values of the errors $\Delta P$ at all loss tangent settings, regardless of the load current, are less than 20 ppm which is within the measurement uncertainty of the wattmeter. This confirms not only the accuracy of the current-comparator-based load loss standard, but also that of the TDM reference wattmeter.

Figure 5:
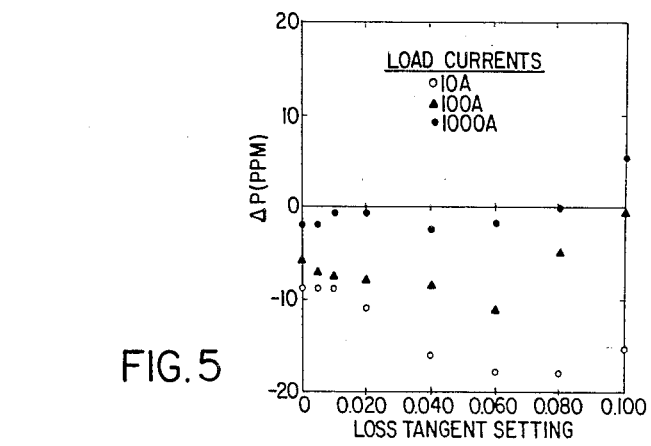
FIGS. 5 and 6 are results of power measurements obtained by the use of the load loss standard of the present invention.
Figure 6:
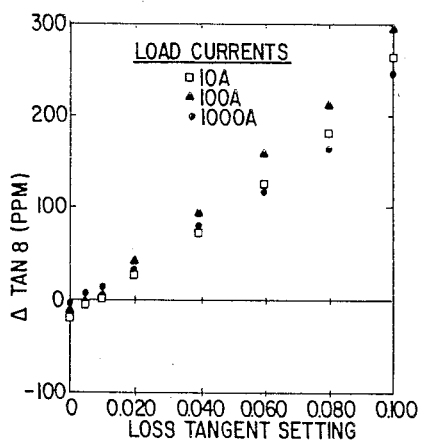

The performance of the current-comparator-based load loss standard was further checked at high voltage by using it to simulate inductive loads with equivalent ratings of 530 kVA, 5.3 MVA, 53 MVA, operating at 53 kV with load currents of 10 A, 100 A and 1000 A respectively. The voltage and current inputs to the reference wattmeter were obtained from the active voltage divider and the range-extending two-stage current transformer of the current comparator (connected in series with the fixed winding $N_1$) respectively. The errors $\Delta P$ at all loss tangent settings, regardless of the load current, were found to agree with those shown in FIG. 4 within the measurement uncertainty of the reference wattmeter. The reference wattmeter, therefore, can be used to provide a direct indication of the reference power $P_L$ seen by the test system. A frequency-compensated high-voltage capacitance bridge, such as that described in U.S. Pat. No. 4,528,498, July 9, 1985 (So), was also used to measure the loss tangent of the load currents. The results are shown in FIG. 5 with $\Delta TAN\ \delta$ defined as the loss tangent reading of the bridge minus the corresponding loss tangent setting of the current-comparator-based load loss standard in ppm. For loss tangent settings of less than 0.010, $\Delta TAN\ \delta$ is less than 10 ppm, indicating the excellent agreement between the loss tangent readings of the bridge and the corresponding loss tangent settings of the load loss standard. For loss tangent settings of greater than 0.010, $\Delta TAN\ \delta$ increases linearly with an increase in the loss tangent setting. This is due to the error of the loss tangent circuitry of the bridge. Although the frequency-compensated high-voltage capacitance bridge has a high basic accuracy of better than $\pm 10$ ppm in both magnitude and phase, its loss tangent circuitry introduces an additional error which eventually becomes dominant as the quadrature component required for balance increases. This error is less than 0.5 percent of the loss tangent reading, as shown in FIG. 5.

I claim:

1. A load loss standard for testing and calibrating a transformer loss measuring system by generating a standard load current when connected to a high voltage source and the said transformer measuring loss system, comprising:
   voltage divider means, to be connected to the said high voltage source, for generating reference signals indicative of a reference load current flowing therethrough,
   current comparator means including first current comparator and having at least first, second, third and detection winding circuits,
   the said first winding circuit to be connected to the said transformer loss measuring system,
   amplifier means connected to the said voltage divider means for generating the said standard load current having a preset loss tangent, in response to the said reference signals and for applying the said standard load current to the said first winding circuit and to the said transformer loss measuring system,
   connecting means connected to the said voltage divider means for applying the said reference signals to the said second and third winding circuits, and
   detection means connected to the said detection winding circuit for generating and applying a feedback signal to the said amplifier means to fine adjust the said standard load current.

2. The load loss standard according to claim 1, further comprising:
   a high voltage reference capacitor, connected between the said high voltage source and the said voltage divider means, through which the said reference load current flows in that the said reference signals are an in-phase reference signal and a quadrature reference signal, each respectively proportional to in-phase and quadrature components of the said reference load current.

3. The load loss standard according to claim 2, wherein the said voltage divider means further includes a variable means for adjusting the said reference signals so that the said standard load current is adjustably set.

4. The load loss standard according to claim 3, wherein the said voltage divider means comprises:
   an active voltage divider to be connected to the said high voltage reference capacitor for generating the said in-phase reference signal,
   a unity gain integrator connected to the said active voltage divider for generating the said quadrature reference signal, and
   a variable inductive voltage divider connected to the said active voltage divider to variably adjust the said in-phase reference signal so that the loss tangent is adjustably set.

5. The load loss standard according to claim 4, wherein the said active voltage divider comprises:
   second current comparator,
   two reference capacitors connected to the said second current comparator,
   operational amplifier means having a feedback circuit connected to the said second current comparator, and
   the said second current comparator and the said operational amplifier having a plurality of gain settings to adjust the gain of the said active voltage divider so that the standard load current is adjustably set.

6. The load loss standard according to claim 4, wherein the said unity-gain integrator comprises:
   third current comparator, and
   operational amplifier means having a feedback circuit connected to the said third current comparator.

7. The load loss current according to claim 5, wherein the said unity-gain integrator comprises:
   third current comparator, and
   operational amplifier means having a feedback circuit connected to the said third current comparator.

8. The load loss standard according to claim 5, wherein the said amplifier means comprises:

a plurality of operational amplifiers and a voltage-to-current converter.

9. The load loss standard according to claim 6, wherein the said amplifier means comprises:
a plurality of operational amplifiers and a voltage-to-current converter.

10. The load loss standard according to claim 7, wherein the said amplifier means comprises:
a plurality of operational amplifiers and a voltage-to-current converter.

11. The load loss standard according to claim 1, wherein the said first winding circuit of the said current comparator means includes a two-stage current transformer.

12. The load loss standard according to claim 4, wherein the said first winding circuit of the said current comparator means includes a two-stage current transformer.

13. The load loss standard according to claim 7, wherein the said first winding circuit of the said current comparator means includes a two-stage current transformer.

14. The load loss standard according to claim 9, wherein the said first winding circuit of the said current comparator means includes a two-stage current transformer.

15. The load loss standard according to claim 10, wherein the said first winding circuit of the said current comparator means includes a two-stage current transformer.

16. The load loss standard according to claim 1, wherein the said detection means comprises:
an operational amplifier, and
a phase sensitive detector.

17. The load loss standard according to claim 1, further comprising:
a first switch provided between the said connecting means and the said current comparator means, and
a second switch in the said amplifier means.

* * * * *